United States Patent [19]

Salloway et al.

[11] Patent Number: 5,602,478
[45] Date of Patent: Feb. 11, 1997

[54] REDUCTION OF RF FIELD DISTURBANCE IN MAGNETIC RESONANCE APPARATUS

[75] Inventors: Anthony J. Salloway, Northamptonshire; David J. Gilderdale, South Devon, both of United Kingdom

[73] Assignee: GEC-Marconi Limited, United Kingdom

[21] Appl. No.: 308,738

[22] Filed: Sep. 19, 1994

[30] Foreign Application Priority Data

Sep. 21, 1993 [GB] United Kingdom ............ 9319498

[51] Int. Cl.$^6$ ........................................... G01R 33/28
[52] U.S. Cl. .................... 324/318; 324/322; 128/653.5
[58] Field of Search ............................. 324/318, 322, 324/300, 311, 314; 128/653.5, 653.2

[56] References Cited

U.S. PATENT DOCUMENTS

| | | | |
|---|---|---|---|
| 4,684,895 | 8/1987 | Misic | 324/322 |
| 4,903,703 | 2/1990 | Igarashi et al. | 128/653.5 |
| 4,985,680 | 1/1991 | Maeda et al. | 324/318 |
| 4,991,587 | 2/1991 | Blakeley et al. | 128/653.5 |
| 5,033,082 | 7/1991 | Eriksson et al. | 379/410 |
| 5,209,233 | 5/1993 | Holland et al. | 128/653.2 |
| 5,284,144 | 2/1994 | Delannoy et al. | 128/653.2 |

FOREIGN PATENT DOCUMENTS

| | | |
|---|---|---|
| 0132785A3 | 7/1984 | European Pat. Off. . |
| 0170307 | 2/1986 | European Pat. Off. . |
| 0239147A1 | 9/1987 | European Pat. Off. . |
| 0498996A1 | 8/1992 | European Pat. Off. . |
| 0597528A1 | 5/1994 | European Pat. Off. . |
| WO90/02513 | 3/1990 | WIPO . |
| WO91/07132 | 5/1991 | WIPO . |
| WO92/21286 | 12/1992 | WIPO . |

Primary Examiner—Sandra L. O'Shea
Assistant Examiner—Raymond Y. Mah
Attorney, Agent, or Firm—Kirschstein et al.

[57] ABSTRACT

In a magnetic resonance apparatus including a transducer (25, 31) positioned in the examination region of the apparatus, the transducer is connected with equipment (49) outside the examination region by way of a lead (47) which is grounded (51, 53) to signals of the frequency of the RF field applied to a subject (5) in the examination region to excite magnetic resonance in the subject, at a distance along the lead from the transducer equal to a quarter wavelength at the RF field frequency (or an odd multiple thereof). Distortion of the RF field due to loading by the transducer is thereby reduced. The transducer may, for example, be a microphone or loudspeaker, e.g. incorporated in an intercom or active noise reduction arrangement, or a sensor for sensing a condition of a patient being examined.

13 Claims, 2 Drawing Sheets

5,602,478

REDUCTION OF RF FIELD DISTURBANCE IN MAGNETIC RESONANCE APPARATUS

BACKGROUND OF THE INVENTION

This invention relates to magnetic resonance apparatus.

Such apparatus can be used for non-invasive internal examinations of patients to produce, for example, cross-sectional internal structural images, and blood flow and spectroscopy data.

In use of such apparatus the part of the patient to be examined is placed in a region of strong static magnetic field to define an equilibrium axis of magnetic alignment in the examination region. A radio frequency (RF) magnetic field is then applied temporarily to the examination region, in a direction orthogonal to the static magnetic field direction, to excite magnetic resonance in material, typically hydrogen protons, in the examination region. The resulting RF signals are detected and analyzed. During this sequence of operations one or more gradients are normally imposed on the static magnetic field in the examination region, e.g. to encode spatially the detected RF signals, or for other purposes such as flow encoding.

In use of such apparatus it is sometimes required to dispose a transducer in the examination region, the transducer being connected to equipment outside the examination region by a lead. Examples of such transducers are microphones and loudspeakers for communication between a patient being examined and a person, e.g. medical staff outside the apparatus, microphones and loudspeakers of an active noise reduction system for reducing disturbance of the patient by noise produced in the magnetic field systems surrounding the patient, and sensors for sensing the condition of the patient e.g. thermometers, and heart rate and respiratory monitors.

One problem which arises with such transducers is that they tend to load the RF fields produced in the examination region, thereby distorting the RF fields and degrading the data obtained by analyzing the detected RF signals.

SUMMARY OF THE INVENTION

It is an object of the present invention to provide a magnetic resonance apparatus wherein this problem is alleviated.

According to the present invention there is provided a magnetic resonance apparatus including a transducer disposed in a region to which there is applied in use of the apparatus an RF field for producing magnetic resonance in a subject for examination by the apparatus, the transducer being provided with a lead which is grounded to signals of the frequency of said RF field at a distance along the lead from the transducer which is equal to a quarter wavelength at said RF field frequency or to an odd multiple thereof.

BRIEF DESCRIPTION OF THE DRAWINGS

One magnetic resonance apparatus in accordance with the invention will now be described, by way of example, with reference to the accompanying drawings in which.

DETAILED DESCRIPTION OF THE PREFERRED EMBODIMENTS

The apparatus, which produces images for medical diagnostic purposes is for the most part of conventional form.

Figure 1:
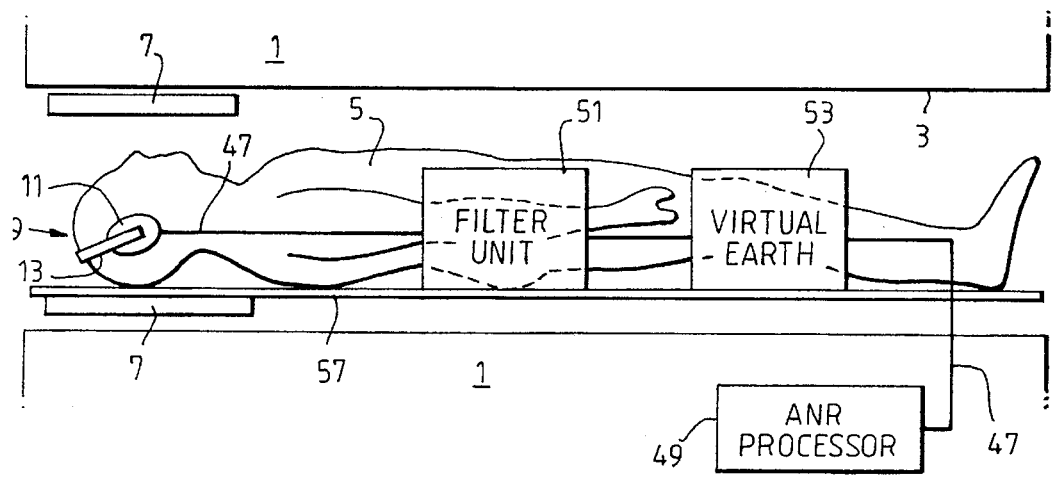
FIG. 1 is a diagram illustrating a patient examination region of the apparatus.

Referring to FIG. 1, the apparatus includes an electromagnet assembly 1 which defines a tubular bore 3 in which, in use of the apparatus, a patient 5 to be examined lies on a patient support 57.

The assembly 1 comprises a main electromagnet which produces a strong, uniform, static magnetic field in the bore 3 in the direction of the axis of the bore, normally referred to as the z-direction. The assembly 1 further includes a gradient coil system whereby a gradient may be imposed on the static magnetic field in the bore 3 in any one or more of three orthogonal directions, i.e. x, y and z directions.

The apparatus further includes an RF coil system 7 whereby RF field pulses may be applied to at least that part of a patient positioned in the bore 3 which it is desired to examine. The applied RF field pulses excite magnetic resonance in the part of the patient to be examined. The RF coil system 7 also serves to detect RF signals resulting from the excited magnetic resonance.

In FIG. 1 the RF coil system 7 is depicted, by way of example, as being of tubular form and disposed coaxial with the bore 1, surrounding the patient's head.

Energization of the electronmagnet assembly 1 and RF coil system 7 and processing of the detected RF signals to produce an image is effected under the control of a computer (not shown) and associated power supply and control equipment (not shown).

In operation of the apparatus the coil assembly 1 and the RF coil system 7 produce a significant amount of noise which can be upsetting to a patient, particularly in the confined space within the RF coil system 7. To reduce this noise to a minimum the patient 3 is provided with an active noise reduction (ANR) arrangement.

The ANR arrangement includes a headset 9 having two earpieces 11 each in the form of an enclosure which fits around a respective ear of the patient 5. The two earpieces 11 are supported on a headband 13 of springy plastics material which serves to urge the earpieces 11 firmly against the patient's head.

Figure 2:
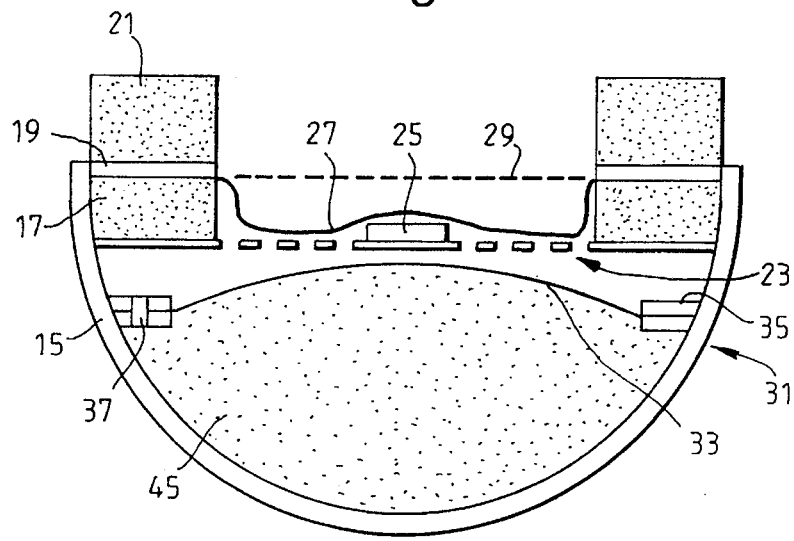
FIG. 2 is a diagram illustrating an earpiece of an active noise reduction headset used in the apparatus.

Referring to FIG. 2, each earpiece 11 includes an outer shell 15 of a polymer-based material which may be loaded, for example, with a material such as glass, carbon, alumina or silica. Within the open end of the shell 15 there fits a plastics foam ring 17 to whose outer end is affixed a rigid flange plate 19 of plastics material, e.g. a polymer-based material, the plate 19 supporting a plastics foam cushion ring 21 which contacts the patient's head.

The enclosure formed by the shell 15 and foam tings 17 and 21 is divided into two parts by a perforated polycarbonate grille 23 which is positioned on the side of the ring 17 remote from the flange plate 19.

A microphone 25 is mounted in the outer part of the enclosure centrally on the outer side of the grille 23 so as to be spaced from the user's ear. Other positions for the microphone 25 may sometimes be preferable e.g. towards one side of the grille 23, or under the flange plate 19, near the user's ear canal opening. The microphone 25 is protected from ingress of material from outside the earpiece 11 by an impermeable membrane 27. A permeable, second membrane 29 is provided outside the impermeable membrane 27 for hygiene reasons, and is changed for each patient. The two membranes 27 and 29 are attached at their outer peripheries to the flange plate 19 and may, if desired, be arranged to cover the cushion ring 21 for additional hygienic protection.

The microphone 25 is non-magnetic, that is to say, it is of a kind which does not utilise a magnetic field for its operation, and is otherwise constructed using substantially only non-ferromagnetic materials. To this end the microphone 25 is suitably of an electret type, but may alternatively be of a piezoelectric or condenser type. One suitable electret microphone is that described in the Journal of the Acoustic Society of America, Vol 40 (1966), part 6, pages 1433 to 1440, but with ferromagnetic materials removed or, where necessary, replaced by non-ferromagnetic material. In particular, the steel case is replaced by a brass case.

Figure 3:
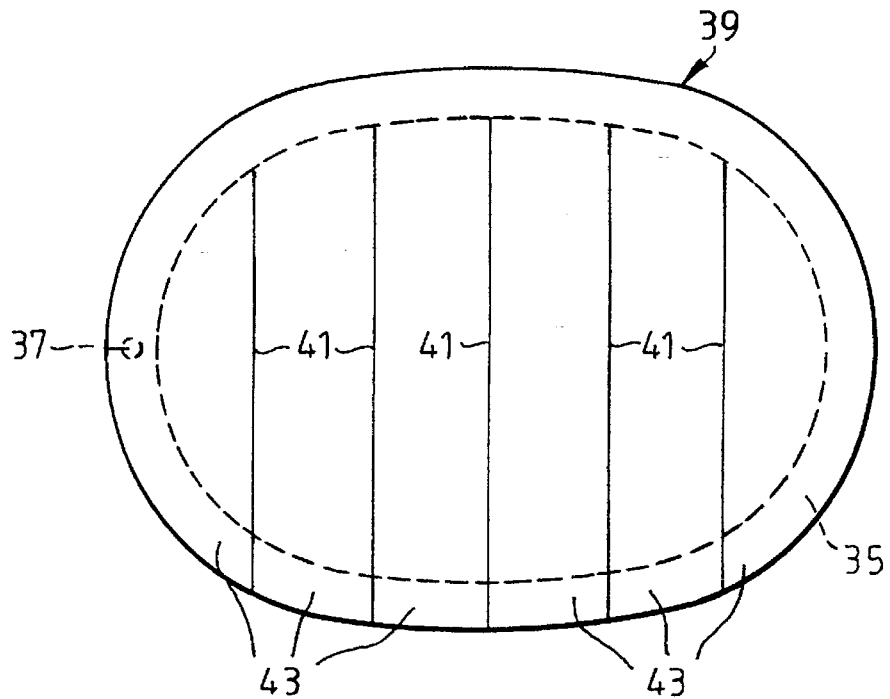
FIG. 3 illustrates the form of an electrode of a transducer of the headset.

The inner part of the earpiece enclosure houses a loudspeaker 31 which is also non-magnetic e.g. a condenser, electret or piezoelectric loudspeaker. In FIG. 2 the loudspeaker 31 is depicted as a piezoelectric loudspeaker which has the advantages that it requires a relatively low drive voltage and no bias voltage. The loudspeaker 31 includes a film 33 of piezoelectric plastics material, for example polyvinylidene fluoride (PVDF), or a co-polymer of PVDF and trifluoroethylene, which is clamped around its periphery between two stiff polymer tings 35, suitably made of polycarbonate, the rings 35 being secured within the shell 15, and being provided with a by-pass hole 37, to equalise air pressure on the two sides of the film 33. The film 33 is provided on each side with an electrode 39 of non-ferromagnetic electrically conductive material, e.g. copper or aluminium. To reduce the possibility of eddy currents circulating in the electrodes 39, which can arise due to the rapid changes in the RF and gradient magnetic fields during an imaging sequence, each electrode 39 is divided by suitably positioned slots 41 into a series of narrow parallel strips 43, electrically connected together at one end, as illustrated in FIG. 3.

When an alternating potential is applied between the electrodes 39 of the film 33, the material of the film 33 expands and contracts in the plane of the film 33. Foam 45 placed behind the film 33 causes the film to dome, as shown in FIG. 2. As a result of this, the expansion and contraction of the film material is converted to a pistophonic motion to generate sound waves directed towards the user's ear corresponding to the applied drive voltage.

Electrical connection to the microphone 25 and loudspeaker 31 of each earpiece 11 is made by way of leads 47 (see FIG. 1) which pass through the shell 15 via grommets (not shown), the leads 47 each being in the form of a twisted pair of wires (not shown) of non-ferromagnetic metal surrounded by a braid screen (not shown) of non-ferromagnetic metal.

It will be appreciated that by virtue of the complete absence of magnetic material in the ANR headset 9, the presence of the headset does not significantly interfere with the homegeneity of the static magnetic and the RF fields in the examination region of the magnetic resonance apparatus. Hence, the presence of the headset 9 does not degrade images produced by the apparatus.

In accordance with the present invention, in order to prevent image degradation by virtue of the headset 9 loading the RF fields in the apparatus, the leads 47 connect the microphones 25 and the loudspeakers 31 to a signal processor 49 of the ANR arrangement by way of a falter unit 51 and a virtual earth arrangement 53.

The processor 49 utilises the signals produced by the microphones 25 to produce signals for application to the loudspeakers 31 of such a form as to minimise the noise heard by the patient 1. Thus the signals are required to be of such a form that the loudspeakers 31 produce at the patient's ears sound waves of the same amplitude and frequency content as, but of opposite phase to, the noise sound waves reaching the patient's ears.

Figure 4:
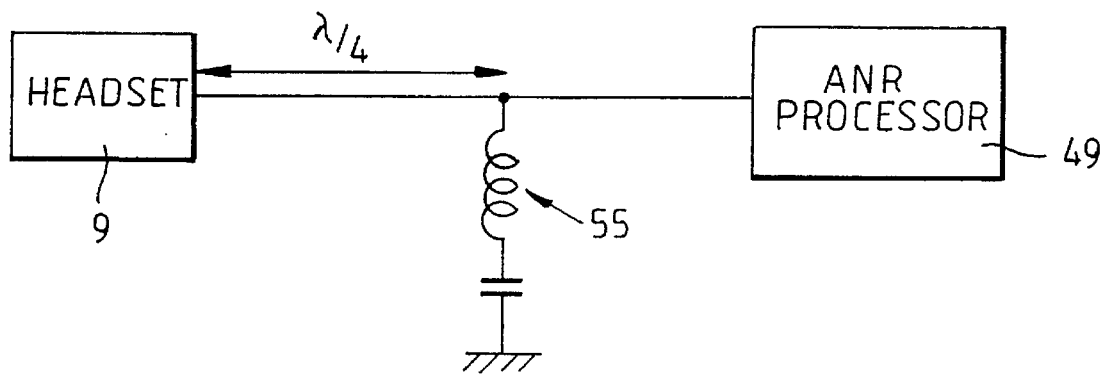
FIG. 4 is a diagram illustrating the form of a lead to a transducer of the headset.

Referring to FIG. 4, the filter unit 51 includes twelve series resonant circuit filters 55 tuned to the frequency of the RF fields applied to the examination region in use of the imaging apparatus, there being one filter 55 for each wire and the screen of each lead 47. Each filter 55 is connected between ground and a point on the associated wire or screen which is at a distance from the associated ANR headset transducer, i.e. microphone 25 or loudspeaker 31, equal to a quarter of a wavelength of waves of the RF field frequency propagating along the transducer lead 47. Each wire and screen is thus effectively grounded to RF field frequencies at this point and consequently presents a high impedance to currents at the RF field frequency at its end adjacent the associated ANR transducer 25 or 31. Hence the presence of the transducers 25 and 31 in the imaging apparatus examination region interferes with, i.e. loads the RF fields produced for imaging to a negligible extent. It will be understood that the passage of audio frequency signals along the loads 47 for noise reduction is not affected.

Where, as is usually the case, a suitable ground connection is not available inside the bore 3 of the imaging apparatus (the bore 3 typically being internally lined with a plastics material cowling), the virtual earth 53 is required. This comprises a line of length equal to a quarter wavelength at the RF field frequency or to an odd multiple thereof, with an open circuit at its end remote from the associated filter 55. The line suitably comprises a serpentine track formed on one side of a plastics material sheet. The serpentine track may suitably be formed on the plastics material bore cowling, where possible.

It will be understood that whilst in the magnetic resonance apparatus described above, by way of example, the ANR transducers are mounted in a headset worn by the patient, this is not necessarily the case. In other apparatus according to the invention incorporating an ANR arrangement, the ANR arrangement transducers may be otherwise supported, e.g. at appropriate places on the RF coil system 7, or other part of the magnetic resonance apparatus per se.

It will also be understood that he technique used for the leads 47 of the microphones 25 and loudspeakers 31 to minimise RF field disturbance may be used with transducers required to be positioned in the examination region of a magnetic resonance apparatus, other than ANR arrangement transducers. Examples of such other transducers are microphones and loudspeakers for communication between a patient and medical staff, and sensors for sensing the condition of a patient e.g. thermometers, and heart rate and respiratory monitors.

We claim:

1. A magnetic resonance apparatus for examining a subject, comprising:
   a) a region in which the subject is positioned during examination;
   b) radio frequency means for applying a radio frequency field having a frequency to the region for producing magnetic resonance in the subject; and c) a transducer disposed in the region and having a lead which is grounded to signals having the frequency of said radio frequency field at a distance along the lead from the transducer which is equal to a quarter wavelength at said radio frequency field frequency or to an odd multiple thereof.

2. The apparatus according to claim 1, wherein said lead is grounded by way of a filter tuned to said frequency.

3. The apparatus according to claim 1, wherein there are a plurality of leads, each lead including a conductor, and each conductor being separately grounded.

4. The apparatus according to claim 3, wherein each lead includes a screen, and each screen is separately grounded.

5. The apparatus according to claim 1, wherein said lead is grounded to a virtual earth.

6. The apparatus according to claim 5, wherein said virtual earth includes an open circuit terminated line of length equal to a quarter of a wavelength at said radio frequency field frequency or to an odd multiple thereof.

7. The apparatus according to claim 6, wherein said line includes a track formed on a cowling of plastics material which surrounds the examination region.

8. The apparatus according to claim 1, wherein said transducer forms a part of an active noise reduction arrangement for use by a human subject being examined in the apparatus.

9. The apparatus according to claim 1, wherein said transducer is an electro-acoustic transducer for use by a human subject being examined in the apparatus for communication with a person outside the apparatus.

10. The apparatus according to claim 1, wherein said transducer is a sensor for sensing a condition of a human subject being examined in the apparatus.

11. The apparatus according to claim 1, wherein said transducer is an acoustic transducer.

12. The apparatus according to claim 1, wherein said transducer is a non-magnetic type transducer.

13. The apparatus according to claim 12, wherein said transducer is a piezoelectric loudspeaker having a film of piezoelectric plastics film carrying an electrode on each main surface and being supported within an enclosure in a domed condition.

* * * * *